United States Patent
Lee et al.

(10) Patent No.: US 8,746,169 B2
(45) Date of Patent: Jun. 10, 2014

(54) MASK FRAME ASSEMBLY FOR THIN FILM DEPOSITION

(75) Inventors: Choong-Ho Lee, Yongin (KR);
Jung-Min Lee, Yongin (KR);
Yoon-Chan Oh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 289 days.

(21) Appl. No.: 12/986,894

(22) Filed: Jan. 7, 2011

(65) Prior Publication Data

US 2011/0168087 A1 Jul. 14, 2011

(30) Foreign Application Priority Data

Jan. 11, 2010 (KR) .................... 10-2010-0002379

(51) Int. Cl.
| | | |
|---|---|---|
| B05C 11/00 | (2006.01) |
| C25D 1/10 | (2006.01) |
| C23C 16/00 | (2006.01) |
| C23C 14/04 | (2006.01) |
| H01L 51/00 | (2006.01) |
| C23C 14/12 | (2006.01) |

(52) U.S. Cl.
CPC .......... *C23C 14/042* (2013.01); *H01L 51/0011* (2013.01); *C23C 14/12* (2013.01); *C05D 1/10* (2013.01)
USPC .......................................... 118/504; 118/715

(58) Field of Classification Search
None
See application file for complete search history.

(56) References Cited

U.S. PATENT DOCUMENTS 4,715,940 A * 12/1987 Boudreau ...................... 427/585
6,221,193 B1 * 4/2001 Cassidy et al. ................ 156/267
(Continued)

FOREIGN PATENT DOCUMENTS

JP    10-265940    10/1998
JP    2003-332057  11/2003
(Continued)

OTHER PUBLICATIONS

Korean Office Action dated Jan. 2, 2012 issued by the KIPO for corresponding Korean Patent Application No. 10-2010-0002379, 4 pages.

*Primary Examiner* — Dah-Wei D. Yuan
*Assistant Examiner* — Jethro Pence
(74) *Attorney, Agent, or Firm* — Christie, Parker & Hale, LLP

(57) ABSTRACT

A mask frame assembly for thin film deposition includes a frame having an opening and at least two unit masks having end parts in a longitudinal direction fixed to the frame, each of the unit masks comprising first regions and second regions, the first regions having unit masking patterns, each of the unit masking patterns having a plurality of openings for thin film deposition, the unit masking pattern being spaced apart from each other, each of the second regions being interposed between a pair of adjacent ones of the first regions, the first regions having a first thickness from a first surface of the unit masks, and at least a portion of the second regions having a second thickness from a second surface of the unit masks opposite to the first surface of the unit masks, such that the first regions and the at least the portion of the second regions are offset from each other in a direction normal to the first and second surfaces. A plurality of unit masks are each half etched from different surfaces and thus a height of wrinkles generated in the mask of the mask frame assembly may be reduced.

10 Claims, 7 Drawing Sheets

(56) References Cited

U.S. PATENT DOCUMENTS

| | | | |
|---|---|---|---|
| 6,589,382 B2 * | 7/2003 | Clark et al. | 156/304.3 |
| 6,749,690 B2 * | 6/2004 | Clark | 118/721 |
| 6,858,086 B2 * | 2/2005 | Kang | 118/720 |
| 6,878,209 B2 * | 4/2005 | Himeshima et al. | 118/720 |
| 6,893,709 B2 * | 5/2005 | Kitazume | 428/192 |
| 7,253,533 B2 * | 8/2007 | Ko | 257/797 |
| 7,572,338 B2 * | 8/2009 | Kim et al. | 118/720 |
| 8,343,278 B2 * | 1/2013 | Sung et al. | 118/720 |
| 2002/0025406 A1 * | 2/2002 | Kitazume | 428/136 |
| 2002/0062785 A1 * | 5/2002 | Kim et al. | 118/504 |
| 2002/0102754 A1 * | 8/2002 | Fujimori et al. | 438/22 |
| 2003/0012981 A1 * | 1/2003 | Yamada et al. | 428/690 |
| 2003/0101932 A1 * | 6/2003 | Kang | 118/504 |
| 2003/0221614 A1 * | 12/2003 | Kang et al. | 118/504 |
| 2004/0021410 A1 * | 2/2004 | Stagnitto et al. | 313/407 |
| 2004/0104197 A1 * | 6/2004 | Shigemura et al. | 216/20 |
| 2004/0123799 A1 * | 7/2004 | Clark | 118/504 |
| 2005/0122030 A1 * | 6/2005 | Sakamoto et al. | 313/496 |
| 2005/0123676 A1 * | 6/2005 | Kuwahara et al. | 427/66 |
| 2006/0051936 A1 * | 3/2006 | Koike | 438/459 |
| 2006/0103289 A1 * | 5/2006 | Kim et al. | 313/402 |
| 2006/0246295 A1 * | 11/2006 | Sakamoto et al. | 428/411.1 |
| 2008/0018236 A1 * | 1/2008 | Arai et al. | 313/504 |
| 2009/0137180 A1 | 5/2009 | Sung et al. | |
| 2010/0055810 A1 * | 3/2010 | Sung et al. | 438/22 |

FOREIGN PATENT DOCUMENTS

| | | |
|---|---|---|
| KR | 10-2003-0046090 | 6/2003 |
| KR | 10-2003-0075221 | 9/2003 |
| KR | 10-2008-0058602 | 6/2008 |
| KR | 10-0836503 | 6/2008 |
| KR | 10-2009-0053418 A | 5/2009 |
| KR | 10-2009-0059225 | 6/2009 |

* cited by examiner

HEIGHT OF WRINKLES = 531.9 μm

HEIGHT OF WRINKLES = 64.88 μm

MASK FRAME ASSEMBLY FOR THIN FILM DEPOSITION

CROSS-REFERENCE TO RELATED APPLICATION

This application claims priority to and the benefit of Korean Patent Application No. 10-2010-0002379, filed on Jan. 11, 2010, in the Korean Intellectual Property Office, the disclosure of which is incorporated herein in its entirety by reference.

BACKGROUND

1. Field

The present invention relates to a mask frame assembly for thin film deposition.

2. Description of Related Art

In general, organic light-emitting display devices have a larger viewing angle, better contrast characteristics, and a faster response speed than other display devices.

Organic light-emitting display devices generally have a stacked structure including an anode, a cathode, and an emission layer interposed between the anode and the cathode, and display images in color when holes and electrons, injected respectively from the anode and the cathode, recombine in the emission layer, thereby emitting light. However, it is difficult to achieve high light-emission efficiency with such a structure, and thus, intermediate layers, including an electron injection layer, an electron transport layer, a hole transport layer, a hole injection layer, or the like, are optionally additionally interposed between the emission layer and respective electrodes.

An intermediate layer including electrodes and an emission layer of an organic light-emitting display device may be formed by using various methods, for example, deposition. When an organic light-emitting display device is manufactured by using deposition, a fine metal mask (FMM) having the same pattern as a thin film to be formed is placed on a substrate, and a thin film material is deposited over the FMM to form the thin film with a desired pattern.

In general, a high-resolution FMM needs to be formed with high precision, and it should be very thin. However, when the mask is made thin, wrinkles may be generated.

That is, a size of a pattern of the high-resolution mask is very small. Accordingly, shadows, which may affect a thickness of a thin film to be deposited, should not exist. In order to reduce or minimize the shadows, the mask should be made very thin.

When the mask is thinned and extended in one axis, wrinkles may be generated in the mask. When the mask having wrinkles is aligned with and deposited on the substrate, an area where the mask has wrinkles and is unable to contact the substrate may be generated. Accordingly, a precision pattern might not be formed on such a non-contact area.

In general, height of the wrinkles may be about 500 to 700 μm and may vary according to a type of the mask and the degree of tensile force used. Wrinkles are generated due to structural instability of the mask and should be removed or minimized. When a thinly processed mask is extended, wrinkles are generated and grown at some point. It is difficult to accurately predict the onset of wrinkling.

SUMMARY

An aspect of embodiments according to the present invention provides a mask frame assembly for thin film deposition for enabling deposition of a precision thin film pattern while preventing wrinkles from being generated in a mask.

In order to achieve the foregoing and/or other aspects of embodiments according to the present invention, according to one embodiment of the present invention, there is provided a mask frame assembly for thin film deposition, the mask frame assembly including a frame having an opening and at least two unit masks having end parts in a longitudinal direction fixed to the frame, each of the unit masks including first regions and second regions, the first regions having unit masking patterns, each of the unit masking patterns having a plurality of openings for thin film deposition, the unit masking pattern being spaced apart from each other, each of the second regions being interposed between a pair of adjacent ones of the first regions, the first regions having a first thickness from a first surface of the unit masks, and at least a portion of the second regions having a second thickness from a second surface of the unit masks opposite to the first surface of the unit masks, such that the first regions and the at least the portion of the second regions are offset from each other in a direction normal to the first and second surfaces.

The first regions may have the first thickness by half etching from the second surface and the at least the portion of the second regions may have the second thickness by half etching from the first surface.

A thickness of the unit masks before etching may be $t_0$, the first thickness may be half of $t_0$ from the first surface and the second thickness may be half of $t_0$ from the second surface.

The first regions may be spaced apart from each other in the longitudinal direction of the unit masks and each of the second regions may extend in a width direction of the unit masks between the pair of adjacent ones of the first regions.

Each of the second regions may include first parts extended from edges of the pair of adjacent ones of the first regions and a second part half etched between the first parts to form the at least the portion of the second region.

The mask frame assembly may further include third regions having a third thickness at edges of the first regions along the width direction of the unit masks, and fourth regions having a fourth thickness at edges of the second regions along the width direction of the unit masks.

The third regions may have the third thickness by half etching from the first surface of the unit masks.

A thickness of the unit masks before etching may be $t_0$, the third thickness may be half of $t_0$ from the second surface and the fourth thickness may be $t_0$.

The first surface may be a surface for contacting a substrate to be patterned.

The openings for thin film deposition of the unit masking patterns may have dot patterns or stripe patterns.

According to another embodiment of the present invention, there is provided mask frame assembly for thin film deposition, the mask frame assembly including a frame having an opening, and at least two unit masks having end parts in a longitudinal direction fixed to the frame, each of the unit masks including first regions and second regions, the first regions having unit masking patterns, each of the unit masking patterns having a plurality of openings for thin film deposition, the unit masking pattern being spaced apart from each other, each of the second regions on which the unit masking patterns are not formed is adjacent respective ones of the first regions, and the first regions and at least a portion of the second regions have thicknesses, respectively, from different surfaces of the unit masks, such that the first regions and the at least the portion of the second regions are offset from each other in a direction normal to the first and second surfaces.

The first regions may be spaced apart from each other along the longitudinal direction of the unit masks, the second regions may be between the first regions, and third regions may be regions formed at edges of the first regions along a width direction of the unit masks, wherein the first regions may have a first thickness from a first surface of the unit masks, and the at least a portion of the second regions and the third regions may have a second and third thickness, respectively, from a second surface of the unit masks that is opposite to the first surface of the unit masks.

The first regions may have the first thickness by half etching from the second surface of the unit mask, and the at least the portion of the second regions and the third regions may have the second and third thicknesses, respectively, by half etching from the first surface.

A thickness of the unit masks before etching is $t_0$, the first thickness is half of $t_0$ from the first surface and the second thickness is half of $t_0$ from the second surface.

Each of the second regions may include first parts extended from edges of a pair of adjacent ones of the first regions, and a second part half etched between the first parts to form the at least the portion of the second region.

The mask frame assembly may further include fourth regions having a fourth thickness at edges of the second regions.

The fourth thickness may be $t_0$.

The first surface may be a surface for contacting a substrate to be patterned.

The openings for thin film deposition of the unit masking patterns may have dot patterns or stripe patterns.

In the mask frame assembly for thin film deposition according to embodiments of the present invention, a plurality of unit masks are half etched from each different surface, and thus, a height of wrinkles generated in the mask of the mask assembly may be reduced.

BRIEF DESCRIPTION OF THE DRAWINGS

The accompanying drawings, together with the specification, illustrate exemplary embodiments of the present invention, and, together with the description, serve to explain the principles of embodiments of the present invention. The above and other features and aspects of the present invention will become more apparent by describing in detail exemplary embodiments thereof with reference to the attached drawings in which.

DETAILED DESCRIPTION

Figure 1:
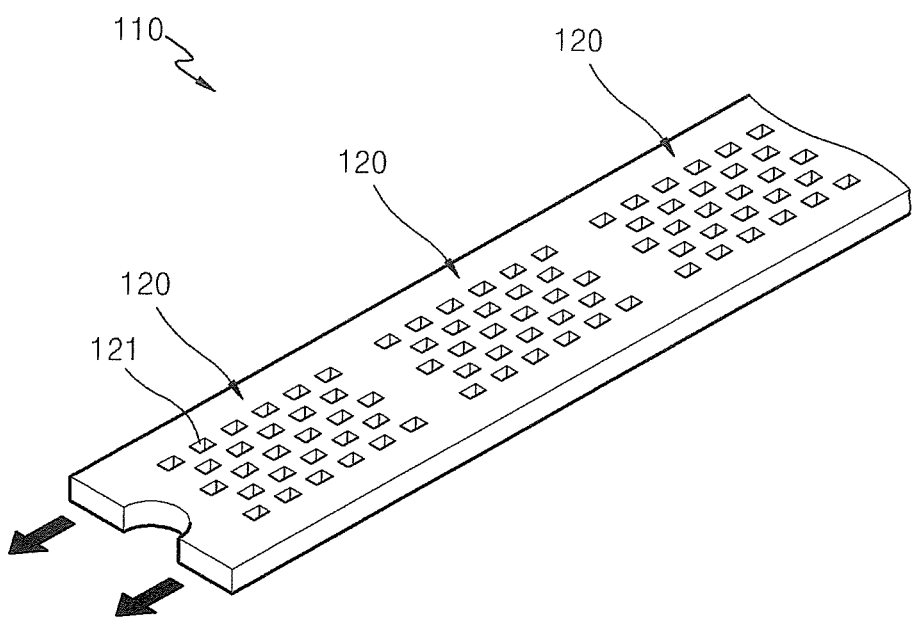
FIG. 1 is a perspective view partially illustrating a conventional unit mask.

FIG. 1 is a perspective view partially illustrating a unit mask 110 of a conventional mask frame assembly.

Referring to FIG. 1, the unit mask 110 is formed of a strip-form thin film and includes a plurality of unit masking patterns 120 formed on the thin film along a longitudinal direction thereof.

The plurality of unit masking patterns 120 each includes a plurality of openings 121 for deposition. The openings 121 may have dot patterns, each of which is discontinuously formed, or stripe patterns that are continuously formed.

Here, while manufacturing the mask frame assembly, wrinkles may be generated in the unit mask 110 due to a tensile force exerted on the unit mask 110 in a direction shown by arrows. When the tensile force of the unit mask 110 is reduced, wrinkles might not be generated. For example, the unit mask 110 may be extended to a point just before the onset of wrinkling. However, when the tensile force of the unit mask 110 is significantly reduced, a masking pattern may be shaken due to a magnetic force or during mask alignment while depositing a pattern of a thin film.

Figure 2:
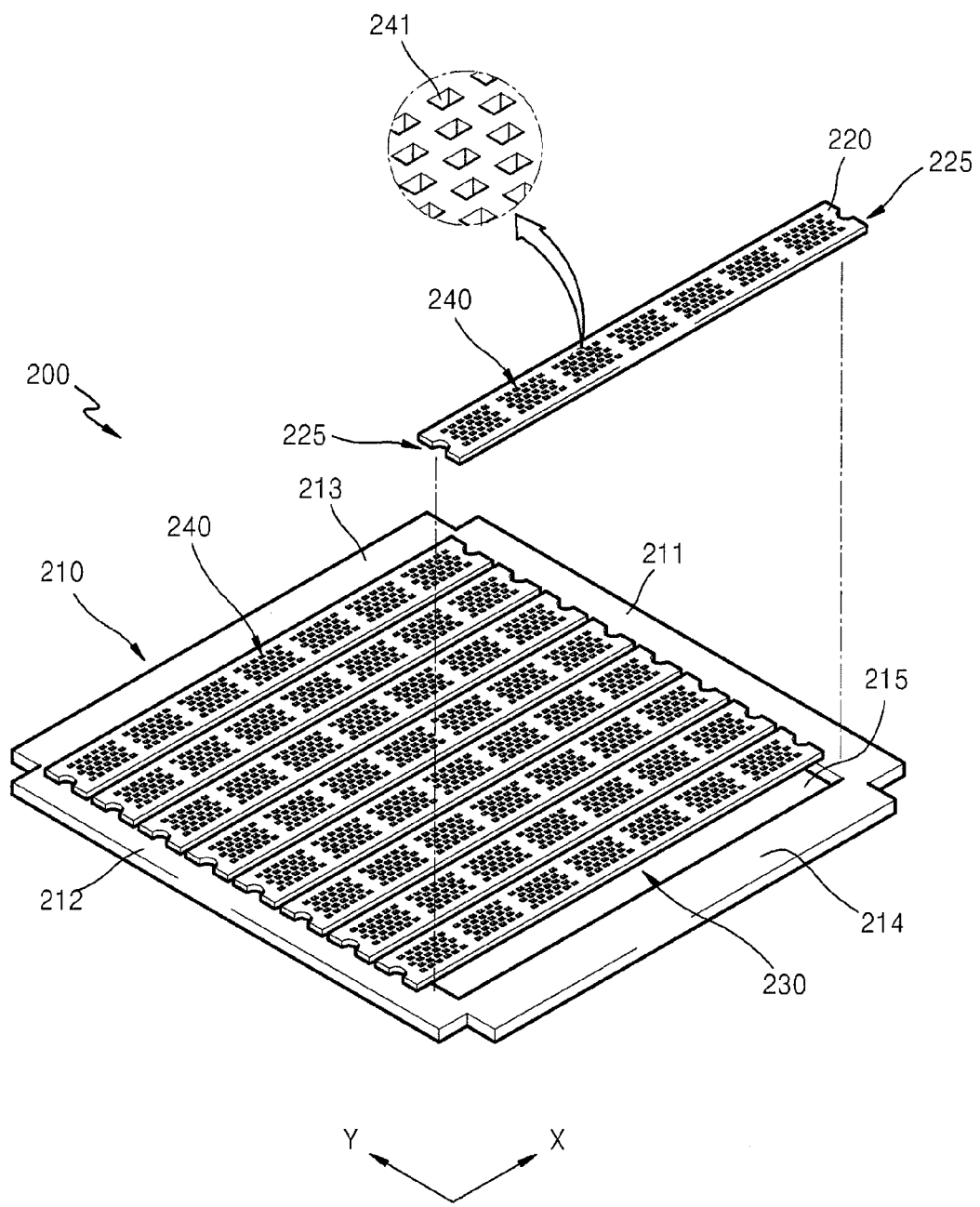
FIG. 2 is an exploded perspective view of a mask frame assembly for thin film deposition, according to an embodiment of the present invention.

FIG. 2 is an exploded perspective view of a mask frame assembly 200 for thin film deposition, according to an embodiment of the present invention.

Here, the mask frame assembly 200 for thin film deposition is applied to pattern a thin film for an organic light-emitting display device, but it may also be applied to any device that requires patterning of a thin film.

Referring to FIG. 2, the mask frame assembly 200 for thin film deposition includes a frame 210 and a plurality of unit masks 220 having opposite end portions 225 supported by the frame 210. The unit masks 220 each have a strip form, and the plurality of unit masks 220 (e.g., strip-form unit masks 220) constitute a mask 230.

The frame 210 includes first supporting units 211 and 212 and second supporting units 213 and 214, wherein the first supporting units 211 and 212 are spaced apart from each other in an X-axis direction and are parallel to each other, and the second supporting units 213 and 214 are spaced apart from each other in a Y-axis direction and are parallel to each other. End portions of the first supporting units 211 and 212 are connected to end portions of the second supporting units 213 and 214 to form an opening (e.g., a rectangular opening) 215.

The second supporting units 213 and 214 are parallel to the strip-form unit masks 220, and may be formed of an elastic material. However, the present invention is not limited thereto. The second supporting units 213 and 214 and the first supporting units 211 and 212 may be integrally formed with each other as a single body. For example, the first supporting units 211 and 212 may be seamlessly formed with the second supporting units 213 and 214 as a single integral piece.

The frame 210 may support the extended strip-form unit masks 220, and thus, may have sufficient hardness. Also, the frame 210 is not limited to any one structure as long as interference does not occur when a material to be deposited and a mask are closely adhered to each other.

The mask 230 may include at least two unit masks 220. The unit masks 220 each include a strip-form (or stripe-form) thin film and a plurality of unit masking patterns 240 that are spaced apart from each other and formed along a longitudinal direction (e.g., x-axis direction) of the unit masks 220.

In the described embodiment of the present invention, 9 unit masking patterns 240 are located along the longitudinal direction (e.g., an X-axis direction) on each unit mask 220; however, the present invention is not limited thereto. One organic light-emitting display device is formed by the unit 5 masking patterns 240.

The unit masking patterns 240 each include a plurality of openings 241 for deposition. The openings 241 for deposition may have dot patterns, each of which is discontinuously formed, or stripe patterns that are continuously formed.

The plurality of strip-form unit masks 220 are magnetized thin films and may be formed of, for example, nickel or a nickel alloy. The plurality of strip-form unit masks 220 may be a nickel-cobalt alloy, which facilitates formation of a fine pattern and has excellent surface roughness.

The strip-form unit masks 220 may be manufactured by using etching in such a way that a resist layer having a same pattern as that of the openings 241 for deposition is formed on a thin film by using photoresist. Alternatively, a film having the pattern of the openings 241 may be attached on a thin film and the thin film may then be etched. Alternately, the openings 241 for deposition may be formed by using electroforming, and the strip-form unit masks 220 may be finely patterned and have excellent surface smoothness.

While a force (e.g., a predetermined tensile force) is exerted in the longitudinal direction of the strip-form unit masks 220, e.g., the X-axis direction, both end portions 225 of the strip-form unit masks 220 manufactured as described above are adhered to the frame 210. Here, the openings 241 of the strip-form unit masks 220 may be located within the opening 215 of the frame 210.

Various methods may be used for adhering, such as laser welding, which may be used in consideration of precision, or resistance heating welding. The strip-form unit masks 220 may be welded to have an interval (e.g., a predetermined interval) therebetween.

Figure 3:
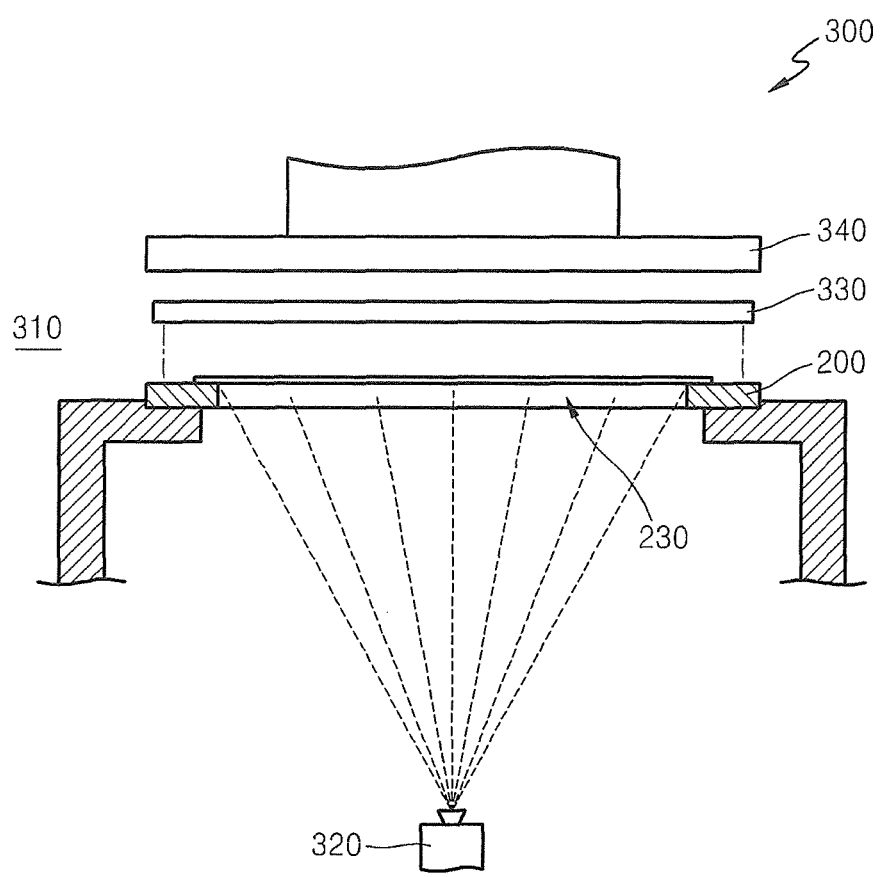
FIG. 3 illustrates a thin film deposition apparatus for depositing an organic layer on a substrate, according to an embodiment of the present invention.

The mask frame assembly 200 for thin film deposition may be installed in a thin film deposition apparatus 300 of FIG. 3 and may be used to perform a deposition process.

FIG. 3 illustrates the thin film deposition apparatus 300 for depositing an organic layer on a substrate, according to an embodiment of the present invention. Referring to FIG. 3, the mask frame assembly 200 is installed to face an organic layer deposition vessel 320 installed in a vacuum chamber 310 in order to deposit thin films of an organic light-emitting display device (e.g., red, green, and blue organic light emission layers) by using the mask 230, and a substrate 330 on which the thin films are to be formed is placed on the mask frame assembly 200.

A magnet unit 340 placed on the substrate 330 is operated to closely adhere the mask 230 supported by the mask frame assembly 200 to the substrate 330 (so that the mask 230 is closely adhered to the substrate 330). Here, the organic layer deposition vessel 320 is operated, and thus, organic materials located at the organic layer deposition vessel 320 are evaporated and then deposited on the substrate 330.

When wrinkles are generated in the mask 230 due to a tensile force exerted on the plurality of unit masks 220 of FIG. 2 included in the mask 230, the mask 230 might not properly contact the substrate 330 when the mask 230 contacts the substrate 330, and thus, a thin film having a desired precision pattern might not be formed.

Accordingly, in order to reduce a size of wrinkles before deposition, half etching is performed on the plurality of unit masks 220 of FIG. 2 included in the mask 230 to reduce or minimize non-uniformity of a thickness of the unit masks 220.

Figure 4:
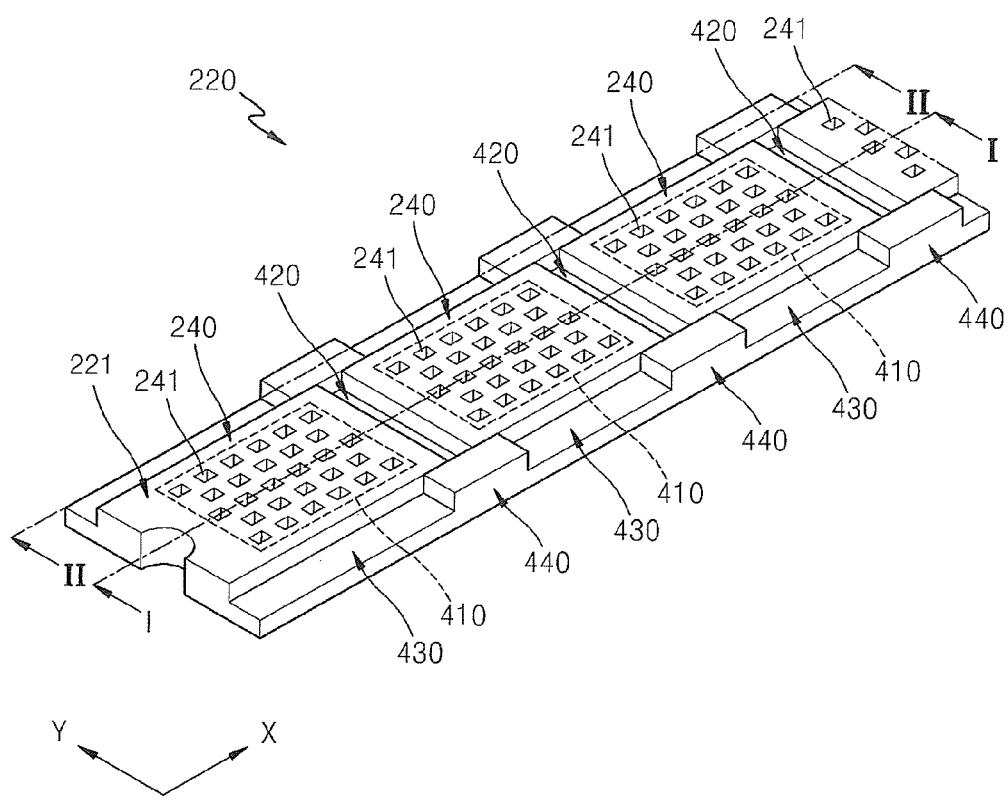
FIG. 4 is an expanded perspective view partially illustrating an embodiment of a unit mask shown in FIG. 2.
Figure 5:
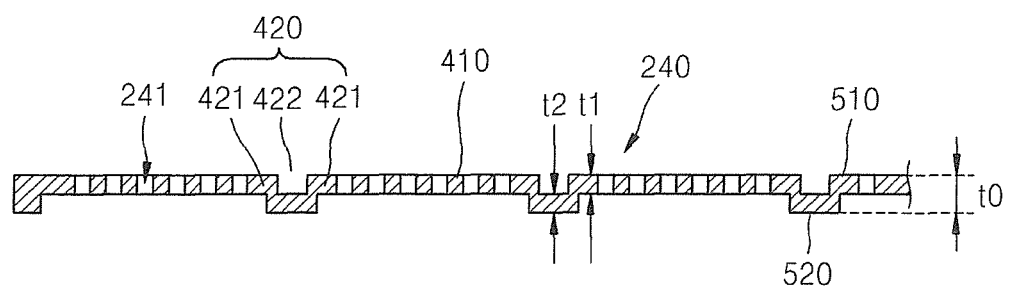
FIG. 5 is a cross-sectional view illustrating an embodiment of the unit mask of FIG. 4 taken along a line I-I of FIG. 4.
Figure 6:
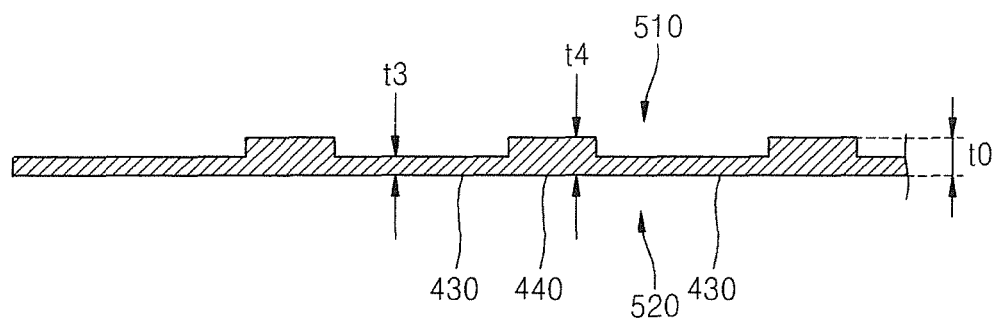
FIG. 6 is a cross-sectional view illustrating an embodiment of the unit mask of FIG. 4 taken along a line II-II of FIG. 4.

FIG. 4 is an expanded perspective view partially illustrating the embodiment of the unit mask 220 shown in FIG. 2, FIG. 5 is a cross-sectional view of the unit mask 220 of FIG. 4 taken along a line I-I of FIG. 4, and FIG. 6 is a cross-sectional view of the unit mask 220 of FIG. 4 taken along a line II-II of FIG. 4.

Referring to FIGS. 4 through 6, the unit mask 220 includes a strip-form thin film 221 extended in an X-axis direction. The strip-form thin film 221 includes the plurality of unit masking patterns 240. The plurality of unit masking patterns 240 each includes the plurality of openings 241 for deposition. The openings 241 for deposition may have dot patterns, each of which is discontinuously formed, or stripe patterns that are continuously formed.

Here, in order to reduce or minimize non-uniformity of a thickness of the unit mask 220, a half etching process may be performed on the unit mask 220 from opposite surfaces thereof, and thus, the unit mask 220 may have a predetermined thickness.

That is, the unit mask 220 includes first regions 410, on which the plurality of unit masking patterns 240 are formed, and second regions 420 having at least a portion thereof interposed between the first regions 410.

The first regions 410 on which the unit masking patterns 240 are formed are spaced apart from each other by an interval (e.g., a predetermined interval) in a longitudinal direction (e.g., the X-axis direction) of the thin film 221, and the second regions 420 on which a pattern is not formed are each extended in a width direction (e.g., the Y-axis direction) of the unit mask 220, with at least a portion of the second regions between a pair of the first regions 410. The first regions 410 may each have a same shape with a same thickness in a longitudinal direction of the unit mask 220, and the at least a portion of the second regions 420 may each have a same shape with a same thickness between the first regions 410.

The first regions 410 on which the unit masking patterns 240 are formed have a first thickness $t_1$ from a first surface 510 of the unit mask 220, and the at least a portion of the second regions 420 between adjacent unit masking patterns 240 have a second thickness $t_2$ from a second surface 520 of the unit mask 220.

Accordingly, an initial thickness of the first regions 410 on which the unit masking patterns 240 are formed is reduced by half etching. When it is assumed that an entire thickness of the unit mask 220 before etching is $t_0$, the first regions 410 on which the unit masking patterns 240 are formed have the first thickness $t_1$ from the first surface 510 of the unit mask 220, which is half of the entire thickness $t_0$.

Accordingly, the first regions 410 on which the unit masking patterns 240 are formed are half etched from the second surface 520 of the unit mask 220, which may be arranged far from the substrate 330, and thus, a thickness of the first regions 410 is reduced to have the first thickness $t_1$, which is half of the original thickness $t_0$ of the unit mask 220.

Unlike the first regions 410, the at least a portion of the second regions 420 (on which a pattern, e.g., a plurality of openings 241, is not formed) between the plurality of unit masking patterns 240 have the second thickness $t_2$ from the second surface 520 of the unit mask 220. The second surface 520 is opposite to the first surface 510 of the unit mask 220.

Accordingly, the at least a portion of the second regions 420 between the plurality of unit masking patterns 240 are half etched from the first surface 510 of the unit mask 220, which is arranged close to the substrate 330, and thus, a thickness of the at least a portion of the second regions 420 is reduced to be the second thickness $t_2$, which is half of the original thickness $t_0$ of the unit mask 220, from the second surface 520. As described above, the at least a portion of the second regions 420 are etched in the unit mask 220 in a direction opposite to that in which the first regions 410 are etched in the unit mask 220. This way, the at least a portion of the second regions 420 is offset from the first regions 410 in a direction normal to the first and second surfaces.

Here, the second regions 420 each include first parts 421 and a second part 422 (e.g., the at least a portion of the second regions) interposed between the first parts 421, wherein the first parts 421 are extended a width (e.g., a predetermined width) from edges of pairs of respective unit masking patterns 240 arranged adjacent to each other along the longitudinal direction of the unit mask 220. The first parts 421 are extended from edges of respective unit masking patterns 240 on which patterns (e.g., a plurality of openings) are not formed for half etching, and the second part 422 interposed between the extended first parts 421 is a part to which half etching is performed. Hence, the second part 422 in one embodiment is the at least the portion of the second region 420 that is offset from the first regions in the direction normal to the first and second surface. Further, the first parts 421 have the thickness $t_0$.

As described above, the first regions 410 on which the unit masking patterns 240 are formed are half etched from the second surface 520, which is arranged far from the substrate 330, and thus, have the first thickness $t_1$ from the first surface 510 of only half of the thickness $t_0$ of the unit mask 220 before etching is performed.

In this case, the unit mask 220 may not be uniform in a direction of the thickness (e.g., a thickness direction or direction normal to the first and second surfaces). In order to prevent this, the at least a portion of the second regions 420 between the adjacent unit masking patterns 240 (on which patterns are not formed) are half etched from the first surface 510 for contacting the substrate 330, and thus the second part 422 of the second regions 420, is reduced to have the second thickness $t_2$, which is half of the thickness $t_0$ of the original unit mask 220.

Accordingly, the first regions 410, on which the unit masking patterns 240 are formed, and the second part 422 of the second regions 420, which are between the adjacent unit masking patterns 240, are each half etched in different directions so that non-uniformity of the unit mask 220 in the direction of the thickness (e.g., the thickness direction) may be reduced or prevented (e.g., so that the problem of non-uniformity may be solved). Here, a shape of a cross-section of half etched parts may be, for example, rectangular or curved.

When the unit masking patterns 240 are spaced apart from each other by an interval (e.g., a predetermined interval) along the longitudinal direction of the unit mask 220, the edges of the unit masking patterns 240 may be formed in a width direction of the unit masking patterns 240. In this case, parts where patterns are not formed are further formed around the unit masking patterns 240 so that a half etching process may be performed on all edges of the unit masking patterns 240. Half etching of all the edges of the unit masking patterns 240 may be performed to reduce non-uniformity in a thickness direction.

That is, the unit masking patterns 240 are spaced apart from each other in the longitudinal direction of the unit mask 220, and edges of the unit mask 220 include third regions 430 and fourth regions 440, wherein the third regions 430 are edges of the first regions 410, and the fourth regions 440 are regions of the second regions 420 interposed between the adjacent unit masking patterns 240.

The third regions 430 may be formed to have the same shape and thickness as each other in the longitudinal direction of the unit mask 220, and the fourth regions 440 may be formed to have the same shape and thickness as each other. The third regions 430 and the fourth regions 440 may be repeatedly formed along the longitudinal direction of the unit mask 220 by varying thicknesses from each other.

Here, thicknesses of the third regions 430, which are adjacent to edges of the first regions 410, are reduced by half etching, and thus, the third regions 430 have a third thickness $t_3$. The third regions 430 are located at edges of the first regions 410 on which the unit masking patterns 240 are formed. Thus, in order to reduce (e.g., solve) non-uniformity in the thickness direction, a half etching process is performed on the third regions 430 from the first surface 510 for contacting the substrate 330, and on which the third regions 430 are to be patterned, in such a way that the third regions 430 are reduced to have the third thickness $t_3$, which is half of the original thickness $t_0$ of the unit mask 220 (e.g., the thickness $t_0$ of the unit mask 220 prior to etching).

On the other hand, a fourth thickness $t_4$ of the fourth regions 440, which are adjacent to edges of the second regions 420, is the same as the thickness $t_0$ of the unit mask 220 prior to etching.

Accordingly, the first regions 410 on which the unit masking patterns 240 are formed are half etched from the second surface 520 of the unit mask 220 so as to have the first thickness $t_1$ from the first surface 510 of the unit mask 220, and the second part 422 of the second regions 420 and the third regions 430 on which patterns are not formed around the first regions 410 are half etched from the first surface 510 of the unit mask 220 so as to have the second and third thicknesses $t_2$ and $t_3$, respectively, so that differences in the thicknesses (e.g., $t_1$, $t_2$, and $t_3$) may be compensated, and thus, the problem of non-uniformity of the unit mask 220 in the thickness direction may be solved.

A change in a height of wrinkles from a conventional unit mask and a unit mask 220 according to an embodiment of the present invention, has been measured, and the results are as follows.

Figure 7A:
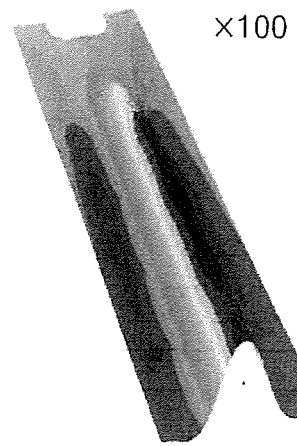
FIG. 7A is a graph showing a height of wrinkles of a conventional unit mask.
Figure 7B:
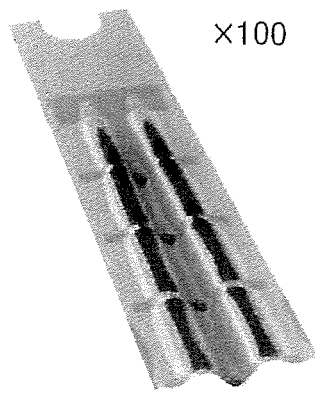
FIG. 7B is a graph showing a height of wrinkles of a unit mask according to an embodiment of the present invention.

FIG. 7A is a graph showing a height of wrinkles of a conventional unit mask and FIG. 7B is a graph showing a height of wrinkles of the unit mask 220 according to an embodiment of the present invention.

Referring to FIG. 7A, a height of wrinkles of the conventional unit mask to which half etching is not performed is 531.9 μm. Referring to FIG. 7B, a height of the wrinkles of the unit mask 220 according to an embodiment of the present invention to which half etching is performed in each different direction is 64.88 μm.

These results indicate that the height of wrinkles of the of the etched unit mask 220 according to an embodiment of the present invention is lower than that of the conventional unit mask by about 467.02 μm. Accordingly, as the height of wrinkles is significantly reduced, surface contact may be significantly improved when the mask 230 is arranged with respect to the substrate 330, and thus, precision thin film patterning may be formed.

An organic light-emitting display device in which an organic light emission layer is deposited by using the mask frame assembly 200 for thin film deposition in which non-uniformity of thickness is reduced or eliminated by half etching according to an embodiment of the present invention is described as follows.

Here, the mask frame assembly 200 for thin film deposition may be used for deposition of various thin films and may be used, for example, in a patterning process of an organic light emission layer. Accordingly, the mask frame assembly 200 according to the described embodiment of the present invention may be applied to patterning of an organic light emission layer of an organic light-emitting display device, and may be applied to cathode deposition in a passive matrix (PM) organic light-emitting display device. In addition, the mask frame assembly 200 according to the described embodiment of the present invention may be applied to formation of an organic thin film transistor.

Figure 8:
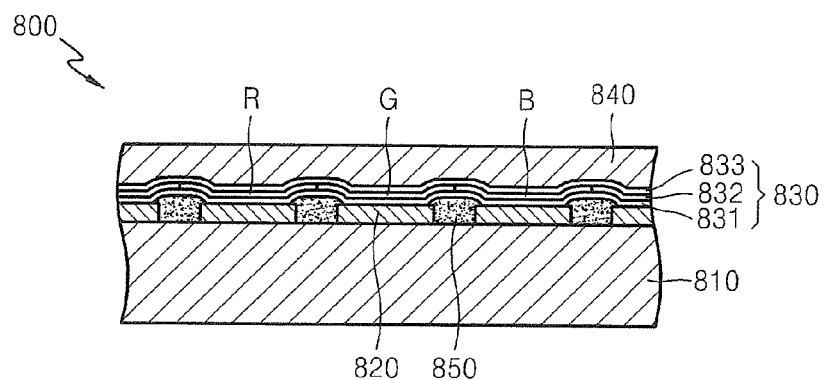
FIG. 8 is a cross-sectional view of a passive matrix organic light-emitting display device, according to an embodiment of the present invention.

FIG. 8 is a cross-sectional view of a passive matrix organic light-emitting display device 800, according to an embodiment of the present invention.

Referring to FIG. 8, a first electrode layer 820 is formed on a glass substrate 810 in a stripe pattern, and an organic layer 830 and a second electrode layer 840 are formed (e.g., sequentially formed) on the first electrode layer 820.

An insulating layer 850 may be further interposed between each line of the first electrode layer 820, and the second electrode layer 840 may be formed in a pattern perpendicular to the pattern of the first electrode layer 820.

The organic layer 830 may be a low molecular weight organic film or a polymer organic film having a large molecular weight.

When the organic layer 830 is a low molecular weight organic film, the organic layer 830 may be formed as a single-layered or multi-layered stack structure including a first organic layer 831 (such as a hole injection layer (HIL) or a hole transport layer (HTL)), an organic emission layer (EML) 832, and a second organic layer 833 (such as an electron transport layer (ETL) or an electron injection layer (EIL)).

Examples of organic materials that may be used to form the organic layer 830 may include various materials such as copper phthalocyanine (CuPc), N,N'-di(naphthalene-1-yl)-N,N'-diphenyl-benzidine (NPB), tris-8-hydroxyquinoline aluminum (Alq3), and/or the like. The low-molecular weight organic layer may be formed by vacuum deposition.

When a polymer organic film is used, the first organic layer 831 as the HTL and the organic EML 832 may be included and the second organic layer 833 may not be used. In this case, the HTL may be formed of poly(ethylenedioxythiophene) (PEDOT), and the organic EML 832 may be formed of a polymer organic material such as polyphenylenevinylenes (PPVs), polyfluorenes, and/or the like. The HTL and the organic EML 832 may be formed by screen printing, inkjet printing, or the like.

Here, red R, green G, and blue B organic EMLs 832 may be included in the organic layer 830, thereby realizing a full color (e.g., a full spectrum of colors). As described above, while wrinkles of the mask 230 are reduced or minimized, the organic EML 832 may be deposited by using the mask frame assembly 200 according to an embodiment of the present invention for thin film deposition, and thus, a precision pattern may be formed.

Here, the first electrode layer 820 functions as an anode, and the second electrode layer 840 functions as a cathode. The first and second electrode layers 820 and 840 may have opposite polarities.

The first electrode layer 820 may be formed as a transparent electrode or a reflective electrode. Such a transparent electrode may be formed of, for example, indium tin oxide (ITO), indium zinc oxide (IZO), zinc oxide (ZnO), and/or indium oxide (In$_2$O$_3$). Such a reflective electrode may be formed by forming a reflective layer from, for example, silver (Ag), magnesium (Mg), aluminum (Al), platinum (Pt), palladium (Pd), gold (Au), nickel (Ni), neodymium (Nd), iridium (Ir), chromium (Cr), and/or a compound thereof, and forming a layer of ITO, IZO, ZnO, or In$_2$O$_3$ on the reflective layer.

The second electrode layer 840 may be formed as a transparent electrode or a reflective electrode. When the second electrode layer 840 is formed as a transparent electrode, the second electrode layer 840 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), and/or a compound thereof, on a surface of the organic layer 830, and forming an auxiliary electrode layer or a bus electrode line thereon from a transparent electrode material, such as ITO, IZO, ZnO, In$_2$O$_3$, and/or the like. When the second electrode layer 840 is formed as a reflective electrode, the reflective layer may be formed by depositing, for example, Li, Ca, LiF/Ca, LiF/Al, Al, Ag, Mg, and/or a compound thereof, on the organic layer 830.

The organic light-emitting display device may be sealed to block oxygen and moisture from penetrating into the organic light-emitting display device.

Figure 9:
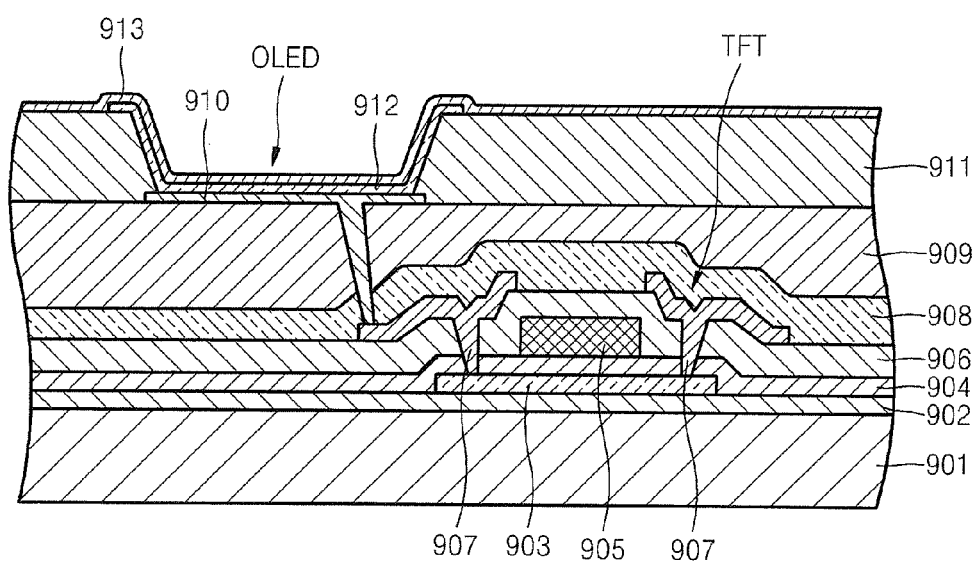
FIG. 9 is a cross-sectional view of an active matrix organic light-emitting display device according to an embodiment of the present invention.

FIG. 9 illustrates sub-pixels of an active matrix organic light-emitting display device formed by deposition using the mask frame assembly 200 of the embodiment shown in FIG. 2, according to an embodiment of the present invention.

Here, the sub-pixels include at least one thin film transistor (TFT) and an organic light emitting device. However, the at least one TFT is not limited to the structure illustrated in FIG. 9, and the number and structure of the TFTs may be modified.

Referring to FIG. 9, a buffer layer 902 is formed on a substrate 901. The substrate 901 may be formed of, for example, glass or plastic. A semiconductor active layer 903 (e.g., having a predetermined pattern) is formed on the buffer layer 902. A gate insulating layer 904 is formed on the semiconductor active layer 903, and a gate electrode 905 is formed in a region (e.g., a predetermined region) of the gate insulating layer 904.

The gate electrode 905 is connected to a gate line that applies a TFT ON/OFF signal. An interlayer insulating layer 906 is formed on the gate electrode 905. Source/drain electrodes 907 are formed to contact the semiconductor active layer 903 through contact holes.

A passivation film 908 formed of, for example, SiO2, SiNx, and/or the like, is formed on the source/drain electrodes 907. A planarization layer 909 is formed of an organic material, such as acryl, polyimide, benzocyclobutene (BCB), and/or the like, is on the passivation film 908.

A pixel electrode 910 that functions as an anode of the organic light emitting device is on the planarization layer 909, and a pixel defining layer (PDL) 911 formed of an organic material covers (a portion of) the pixel electrode 910. An opening is formed in the PDL 911, and an organic layer 912 is formed on both a surface of the PDL 911 and a surface of the pixel electrode 910 exposed through the opening. The organic layer 912 includes an EML. The structure of the organic light-emitting display device is not limited to the above, and various structures of organic light-emitting display devices may be used.

The organic light emitting device displays images (e.g., predetermined image information) by emitting red, green, and blue light as current flows therethrough. The organic light emitting device includes the pixel electrode 910, which is connected to the source/drain electrode 907 of the TFT and to which a positive power voltage is applied, an opposite electrode 913 as a second electrode, which is formed to cover the entire sub-pixel and to which a negative power voltage is applied, and the organic layer 912, which is interposed between the pixel electrode 910 and the opposite electrode 913 to emit light.

The pixel electrode 910 and the opposite electrode 913 are insulated from each other by the organic layer 912, and respectively apply voltages (e.g., voltages of opposite polarities) to the organic layer 912 to induce light emission in the organic layer 912.

The pixel electrode 910 functions as an anode, and the opposite electrode 913 functions as a cathode. The pixel electrode 910 and the opposite electrode 913 may have opposite polarities.

The pixel electrode 910 may be formed as a transparent electrode or a reflective electrode.

When the pixel electrode 910 is formed as a transparent electrode, the pixel electrode 910 may be formed of, for example, indium tin oxide (ITO), indium zinc oxide (IZO), zinc oxide (ZnO), and/or indium oxide ($In_2O_3$). When the pixel electrode 910 is formed as a reflective electrode, the pixel electrode 910 may be formed by forming a reflective layer from, for example, silver (Ag), magnesium (Mg), aluminum (Al), platinum (Pt), palladium (Pd), gold (Au), nickel (Ni), neodymium (Nd), iridium (Ir), chromium (Cr), and/or a compound thereof, and forming a layer of, for example, ITO, IZO, ZnO, or $In_2O_3$ on the reflective layer.

The opposite electrode 913 may be also formed as a transparent electrode or a reflective electrode.

When the opposite electrode 913 is formed as a transparent electrode, the opposite electrode 913 functions as a cathode. Such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof, on the organic layer 912, and then forming an auxiliary electrode layer or a bus electrode line thereon from a transparent electrode material, such as ITO, IZO, ZnO, $In_2O_3$, and/or the like. When the opposite electrode 913 is formed as a reflective electrode, the reflective layer may be formed by depositing, for example, Li, Ca, LiF/Ca, LiF/Al, Al, Ag, Mg, and/or a compound thereof, all of the organic layer 912.

When the pixel electrode 911 is formed as a transparent electrode or a reflective electrode, the pixel electrode 911 may be formed to correspond to a shape of an opening of each sub-pixel. Also, the opposite electrode 913 may be formed by depositing a transparent electrode or a reflective electrode on an entire surface of a display region. However, the opposite electrode 913 may also be formed in various patterns (e.g., not deposited on the entire surface). The location of the pixel electrode 910 and the opposite electrode 913 may be opposite to each other.

The organic layer 912 may be a low molecular weight organic film or a polymer organic film having a large molecular weight.

When the organic layer 912 is a low molecular weight organic film, the organic layer 912 may be formed as a single-layered or multi-layered stack structure including at least one layer selected from the group consisting of a hole injection layer (HIL), a hole transport layer (HTL), an emission layer (EML), an electron transport layer (ETL), and an electron injection layer (EIL).

Examples of organic materials that may be used to form the organic layer 912 may include materials such as copper phthalocyanine (CuPc), N,N'-di(naphthalene-1-yl)-N,N'-diphenyl-benzidine (NPB), tris-8-hydroxyquinoline aluminum (Alq3), and/or the like. The low-molecular weight organic layer may be formed by vacuum deposition.

When the organic layer 912 is a polymer organic film, the organic layer 912 includes the HTL and the EML. In this case, the HTL may be formed of poly(ethylenedioxythiophene) (PEDOT), and the EML may be formed of a polymer organic material such as polyphenylenevinylenes (PPVs), polyfluorenes, and/or the like. The HTL and the EML may be formed by screen printing, inkjet printing, and/or the like.

The organic layer 912 is not limited to the organic layers described above, and may be embodied in various ways.

While the present invention has been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A mask frame assembly for thin film deposition, the mask frame assembly comprising:
    a frame having a single opening; and
    at least two unit masks covering the opening, having end portions in a longitudinal direction fixed to the frame, and having planar surfaces at an upper level, a lower level, and a middle level between the upper level and the lower level, the unit masks being between the upper level and the lower level, a representative unit mask of the unit masks comprising:
        first regions and second regions successively arranged in the longitudinal direction and integrally formed on the representative unit mask, the first regions having corresponding first top surfaces at the upper level and first bottom surfaces at the middle level, the first regions having corresponding unit masking patterns, each of the unit masking patterns having a plurality of openings for thin film deposition, the unit masking patterns being spaced apart from each other by the second regions, the second regions having corresponding pairs of second top surfaces at the upper level, second bottom surfaces at the lower level, and valleys enclosed by first opposing walls formed at edges of the corresponding pairs of second top surfaces and having floors at the middle level, a representative second region of the second regions of the representative unit mask comprising:
            one of the pairs of second top surfaces, one of the second bottom surfaces, and one of the valleys having one of the floors interposed between a pair of adjacent ones of the first regions of the representative unit mask, the pair of adjacent ones of the first regions having a first thickness in a thickness direction from a first side of the representative unit mask at the upper level to a second side of the representative unit mask opposite to the first side at the middle level, the one of the floors having a second thickness in the thickness direction from the one of the floors at the middle level to the one of the second bottom surfaces at the lower level, such that the pair of adjacent ones of the first regions is offset from the one of the valleys in the thickness direction.

2. The mask frame assembly of claim 1, wherein the pair of adjacent ones of the first regions have the first thickness formed by half etching to the middle level from the second side, and the one of the valleys has the second thickness formed by half etching to the middle level from the first side.

3. The mask frame assembly of claim 2, wherein a thickness of the representative unit mask from the upper level to the lower level before etching is $t_0$, the first thickness from the upper level to the middle level is half of $t_0$ from the first side, and the second thickness from the lower level to the middle level is half of $t_0$ from the second side.

4. The mask frame assembly of claim 2, wherein the pair of adjacent ones of the first regions are spaced apart from each other in the longitudinal direction of the representative unit mask, and the one of the floors extends along the middle level in a width direction of the representative unit mask between the pair of adjacent ones of the first regions.

5. The mask frame assembly of claim 4, wherein
the one of the pairs of second top surfaces extends in the longitudinal direction from corresponding edges of the pair of adjacent ones of the first regions, and
the one of the valleys is further formed by half etching between the one of the pairs of second top surfaces.

6. The mask frame assembly of claim 4, wherein the representative unit mask further comprises:
third regions having corresponding third top surfaces at the middle level and third bottom surfaces at the lower level, having a third thickness in the thickness direction from the third top surfaces at the middle level to the third bottom surfaces at the lower level, and extending in the width direction from corresponding edges of the first regions; and
fourth regions having corresponding fourth top surfaces at the upper level and fourth bottom surfaces at the lower level, having a fourth thickness in the thickness direction from the fourth top surfaces at the upper level to the fourth bottom surfaces at the lower level, and extending in the width direction from and forming second opposing walls for enclosing corresponding said valleys of the second regions.

7. The mask frame assembly of claim 6, wherein the third regions have the third thickness formed by half etching to the middle level from the first side of the representative unit mask.

8. The mask frame assembly of claim 7, wherein a thickness of the representative unit mask from the upper level to the lower level before etching is $t_0$, the third thickness from the lower level to the middle level is half of $t_0$ from the second side, and the fourth thickness from the upper level to the lower level is $t_0$.

9. The mask frame assembly of claim 1, wherein the first side at the upper level is a surface for contacting a substrate to be patterned.

10. The mask frame assembly of claim 1, wherein the openings for thin film deposition of the unit masking patterns have dot patterns or stripe patterns.

* * * * *